United States Patent [19]

McHugh

[11] Patent Number: 5,609,495
[45] Date of Patent: Mar. 11, 1997

[54] ZERO INSERTION FORCE CONNECTOR AND CONTACT THEREIN

[75] Inventor: Robert G. McHugh, Evergreen, Colo.

[73] Assignee: Hon Hai Precision Ind. Co., Ltd., Taiwan

[21] Appl. No.: 541,420

[22] Filed: Oct. 10, 1995

Related U.S. Application Data

[62] Division of Ser. No. 93,321, Jul. 16, 1993, Pat. No. 5,456,613.

[51] Int. Cl.$^6$ .................................................. H01R 11/22
[52] U.S. Cl. ............................................ 439/268; 439/856
[58] Field of Search ...................................... 439/259, 262, 439/263, 264, 265, 266, 267, 268, 269, 856, 857

[56] References Cited

U.S. PATENT DOCUMENTS

| | | | |
|---|---|---|---|
| 4,744,768 | 5/1988 | Rios | 439/262 |
| 5,059,135 | 10/1991 | Matsuoka et al. | 439/268 |
| 5,147,213 | 9/1992 | Funk et al. | 439/266 |
| 5,213,530 | 5/1993 | Uratsuji | 439/268 |
| 5,342,213 | 8/1994 | Kobayashi | 439/268 |

*Primary Examiner*—Hien Vu

[57] ABSTRACT

A ZIF PGA socket assembly (1) includes a base housing (10) having a top surface (12) and a plurality of elongated cavities (14), and a corresponding number of contacts (100) each having a pair of elongated spaced arms (108, 110) disposed in respective cavities (14). A sliding plate (70) which designedly slidably moves on the top surface (12) of the base housing (10), has a plurality of orifices (74) therethrough in registration with the corresponding cavities (14) in the base housing (10) to not only admit conductive pins from a PGA component into the cavities (14) but also bias one arm (108) of each contact (100) to form an enlarged space between such pair of arms (108, 110) for zero insertion force for conductive pins of the PGA component when the sliding plate (70) is in an operation position. A cover (50) is mounted on the top of the sliding plate (70) for cooperation with the base housing (10) to sandwich the sliding plate (70) therebetween.

3 Claims, 10 Drawing Sheets

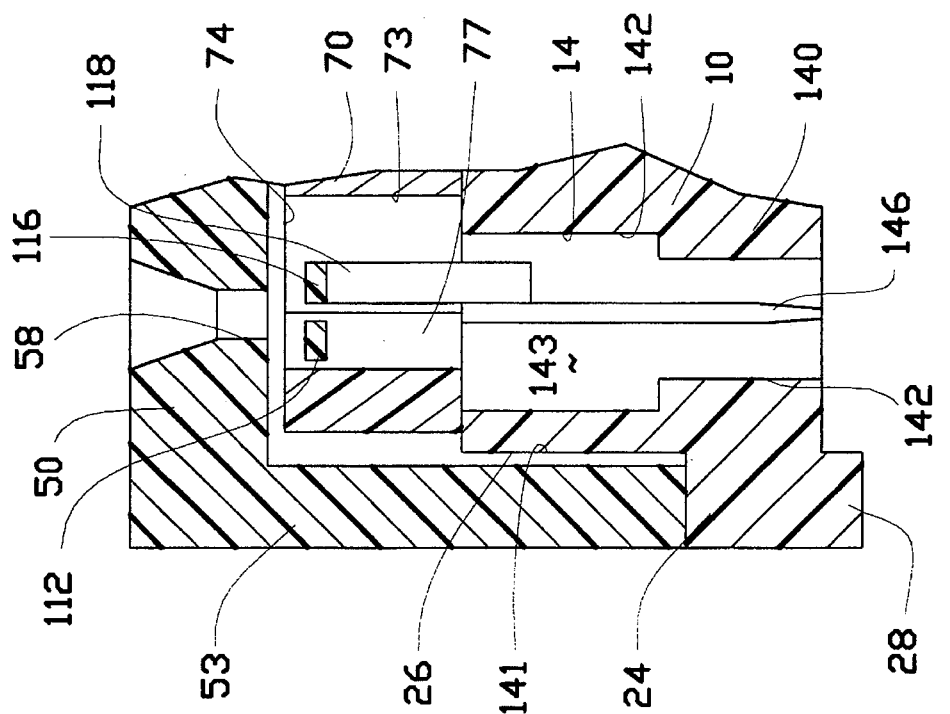
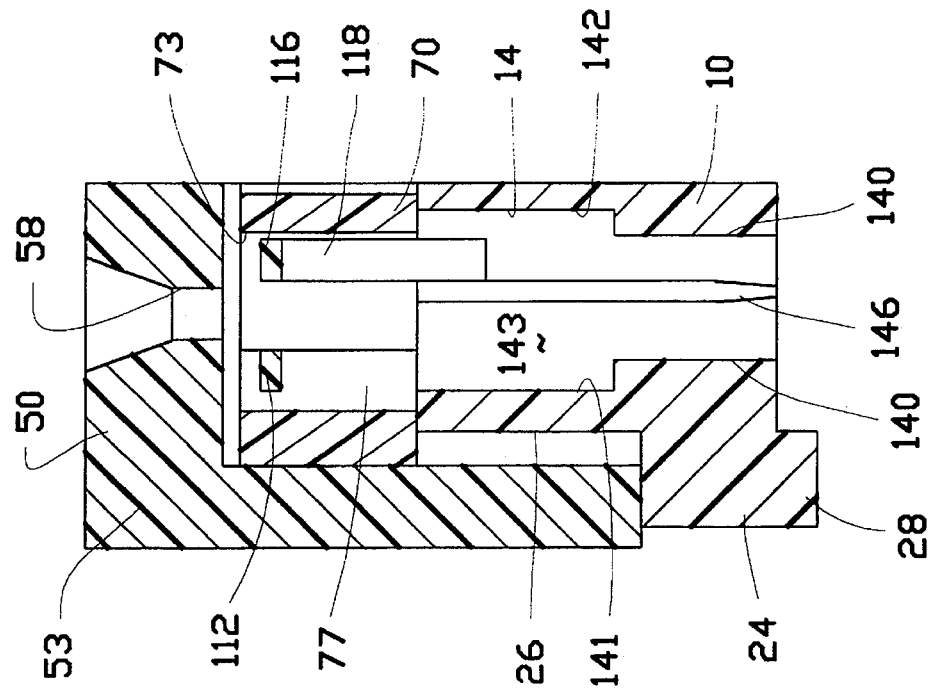
FIG. 9 (A)
FIG. 9 (B)

5,609,495

ZERO INSERTION FORCE CONNECTOR AND CONTACT THEREIN

This is a division of application Ser. No. 08/093,321 filed Jul. 16, 1993 U.S. Pat. No. 5,456,613.

BACKGROUND OF THE INVENTION

1. Field of The Invention

The present invention relates to zero insertion force (ZIF) connectors, especially to a ZIF pin grid array (PGA) connector including a top cover, an intermediate sliding plate and a base housing.

2. The Prior Art

PGA connectors have been developed for a long time and many U.S. Patents are related thereto. One type generally called low insertion force (LIF) connector, is described in U.S. Pat. Nos. 3,676,832, 4,498,725, 4,988,310, 5,002,499, 5,013,256, 5,057,031 and 5,092,789 wherein the contacts are embedded within the respective cavities in the base housing, and a sliding plate carries an above PGA electrical component having a plurality of conductive pin extending downward out of the sliding plate to laterally or horizontally move with regard to the base housing. The conductive pin of PGA can be downward inserted through the slide plate into the base housing without interference initially, and then laterally, i.e. horizontally, moved to engage and be sandwiched within two horizontal resilient arms of the contact in the cavity of the base housing subsequently. Such engagement between the conductive pin of the PGA component and the contact of the socket housing is in a form of low insertion force (LIF).

The second type can been seen in U.S. Pat. Nos. 5,017,152, 5,037,321, 5,059,135, 5,186,642, and 5,192,221, in which one generally vertical beam of a pair of contact beams can be moved or deflected along with the sliding or moveable plate when such sliding plate is actuated to horizontally move along the top surface of the base housing. The outwardly lateral movement of one beam of such pair of contact beams results in expansion of the space between such pair of beams so that the conductive pin of the PGA component can be inserted into the space between such pair of contact beams in the cavity of the base housing without interference, i.e., zero insertion force (ZIF). Consequently, the sliding plate moves back transversely to its original position, and the deflected beam can restore itself to the original position by its inherent resilience and cooperate with another opposite beam to electrically engage the inserted conductive pin of the PGA component therebetween.

Similar to the second type, the third type PGA connector also uses the sliding plate to movably deflect the top portion of the contact beam. Differently, the third type design generally uses a pair of sliding plates which move horizontally with regard to the base housing and in opposite directions with each other to urge such two beams of the contact in the base housing, respectively. Hence, such pair of beams are simultaneously outwardly biased to expand the opening therebetween to receive the inserted conductive pin of PGA under a ZIF condition. After the PGA pin is completely vertically loaded within two contact beams, both sliding plates move back in opposite directions relative to each other, to their original positions, respectively. Therefore, such pair of contact beams restoratively move close to each other for electrically tightly engaging the conductive pin of PGA inserted therebetween. For example, there are U.S. Pat. Nos. 4,468,072, 4,674,811, 4,836,798, 4,889,499 and 5,123,855 disclosing the similar manner.

Regardless of two-piece (i.e. one sliding plate associated with the base housing) PGA connector or three-piece (i.e. two sliding plates associated with the base housing) PGA connector, the respective designs have their individual advantages and disadvantages from the viewpoints of mechanical function, manufacturing process and economic consideration.

An object of the present invention is to provide a three-piece (i.e. a sliding plate sandwiched between a cover and the base housing) PGA connector which may not only be easily and economic manufactured and assembled, but also have good function and performance in cooperation with the PGA component.

SUMMARY OF THE INVENTION

According to the invention, a ZIF PGA socket includes a base housing having a top surface and a plurality of elongated cavities, and a corresponding number of contacts having a pair of elongated arms disposed in respective elongated cavities. A sliding plate which designedly slidably moves on the top surface of the base housing, has a plurality of orifices therethrough in registration with the corresponding cavities to not only admit conductive pins from PGA into the cavities but also bias one arm of each contact to form an expanded space between such pair of arms of each contact for zero insertion force for conductive pins of the PGA component when the sliding plate is in an operation position. A cover is mounted on the top of the sliding plate for cooperation with the base housing to sandwich the sliding plate therebetween wherein the cover and the sliding plate are commonly moved horizontally in a same direction along the top surface of the base housing and such horizontal movement is actuated by rotating an operation handle of an actuation lever beside the base housing, from which a transmission or cam shaft extends to push the sliding plate and the above cover to move outwardly.

BRIEF DESCRIPTION OF THE DRAWINGS

FIG. 9(A) is a fragmentary cross-sectional view of the assembled socket assembly of FIG. 1 to show the relationships among the cover, the sliding plate, the base housing and the contacts therein when the operation handle of the actuation lever is positioned in a horizontal position.

FIG. 9(B) is a fragmentary cross-sectional view of the assembled socket assembly of FIG. 1..to show the relationships among the cover, the sliding plate, the base housing and the contacts therein when the operation handle of the actuation lever is positioned in a vertical position.

DESCRIPTION OF THE INVENTION

Figure 1:
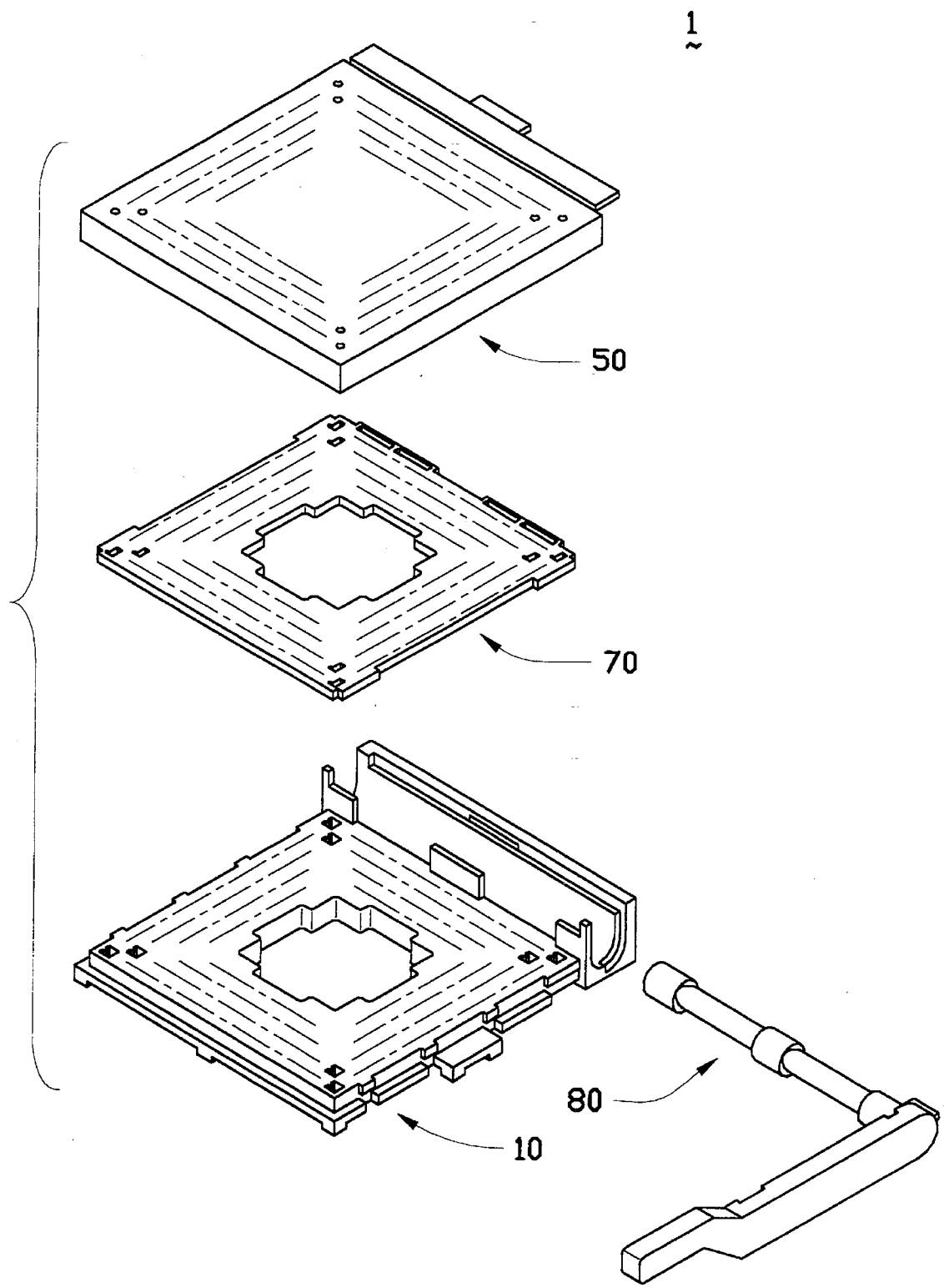
FIG. 1 is an exploded prospective view of the presently preferred embodiment of a ZIF PGA socket assembly without the contacts therein according to this invention.
Figure 2:
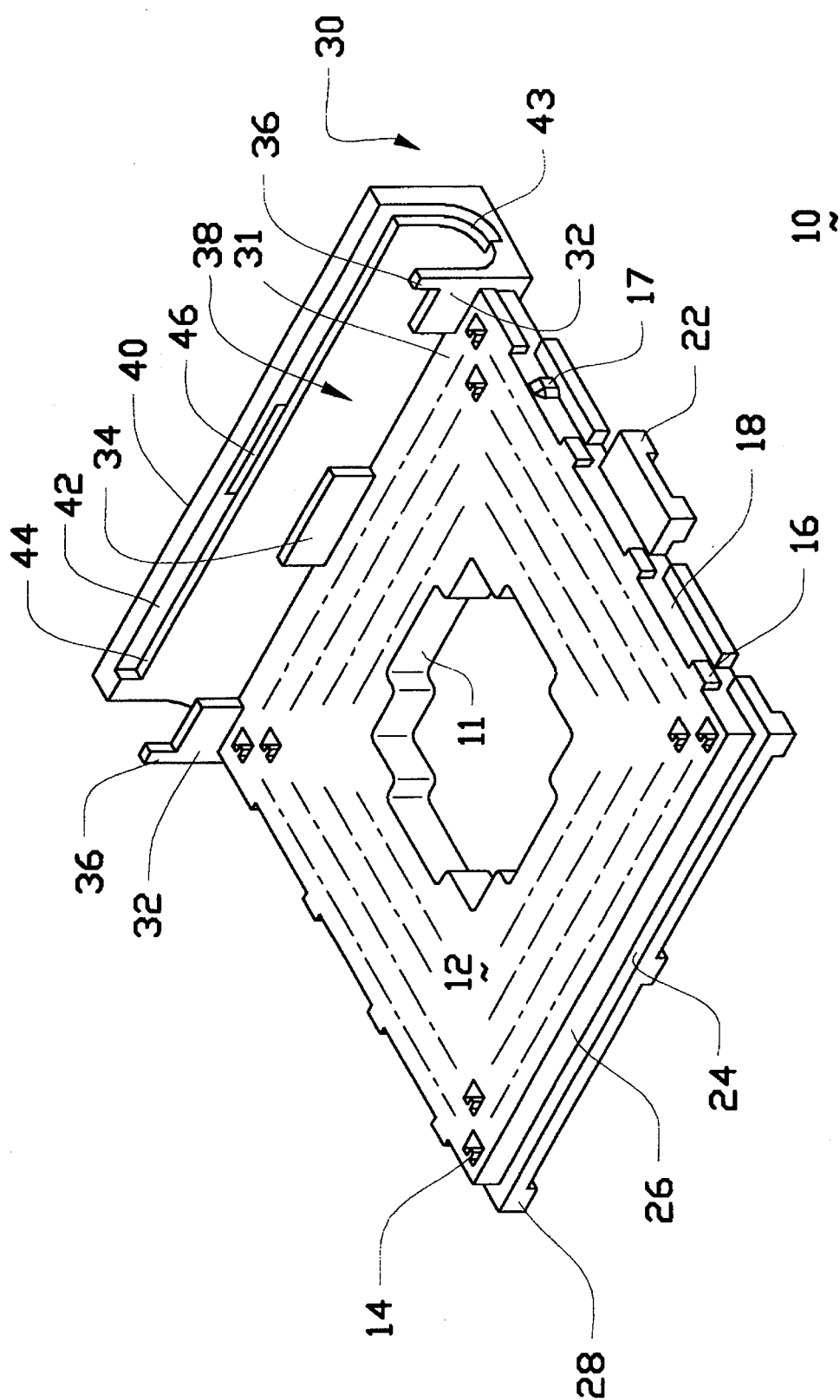
FIG. 2 is a prospective view of the base housing of the socket assembly of FIG. 1.

As shown in FIGS. 1 and 2, a ZIF PGA socket 1 of the present invention includes a base housing 10 including a generally square main body 12 and a plurality of cavities 14 vertically extending therethrough for receiving the corresponding contact 100 therein, respectively. A first set of ledges 16 are formed along the upper portion of each of the left and right side surfaces 18. Oppositely, a second set of ledges 20 are formed along the lower portion of each side surface 18. A pair of standoffs 22 extend downward from the bottom surface of the middle ledge 20 for abutting against the board (not shown) on which the socket 1 is mounted. A front ledge 24 extends forwardly from the lower portion of the front side surface 26 and plural standoffs 28 extend downward from the bottom surface thereof.

An elongated shroud section 30 is positioned at the rear end of the housing 10, and has generally a U-shaped vertical cross-section taken in a lateral direction. A pair of end walls 32 and an intermediate wall 34 extend upwardly from the front side portion 31 of the shroud section 30 which is positioned adjacent the rear portion of the square body 12. A protrusion 36 upward extends from the top of a side portion of each end wall 32. By a generally U-shaped cross-section channel 38, a vertically extending rear side portion 40 is spaced from the front side portion 31 of the shroud section 30 in a front-to-back direction. A shallow horizontal groove 42 lengthwise extends along the inner surface, which is facing the U-shaped channel 38, of the rear side portion 40 of the shroud section 30, such that a step 44 is formed thereof. An elongated aperture 46 is positioned beside the groove 42 and is open to the channel 38. The groove 42 further downward extends along the inner surface of the rear side portion 40, when it reaches the right side end thereof, to form a vertical groove 43. The vertical groove 43 terminates generally at the bottom midpoint of the cross-sectional configuration of the U-shaped channel 38.

Figure 3:
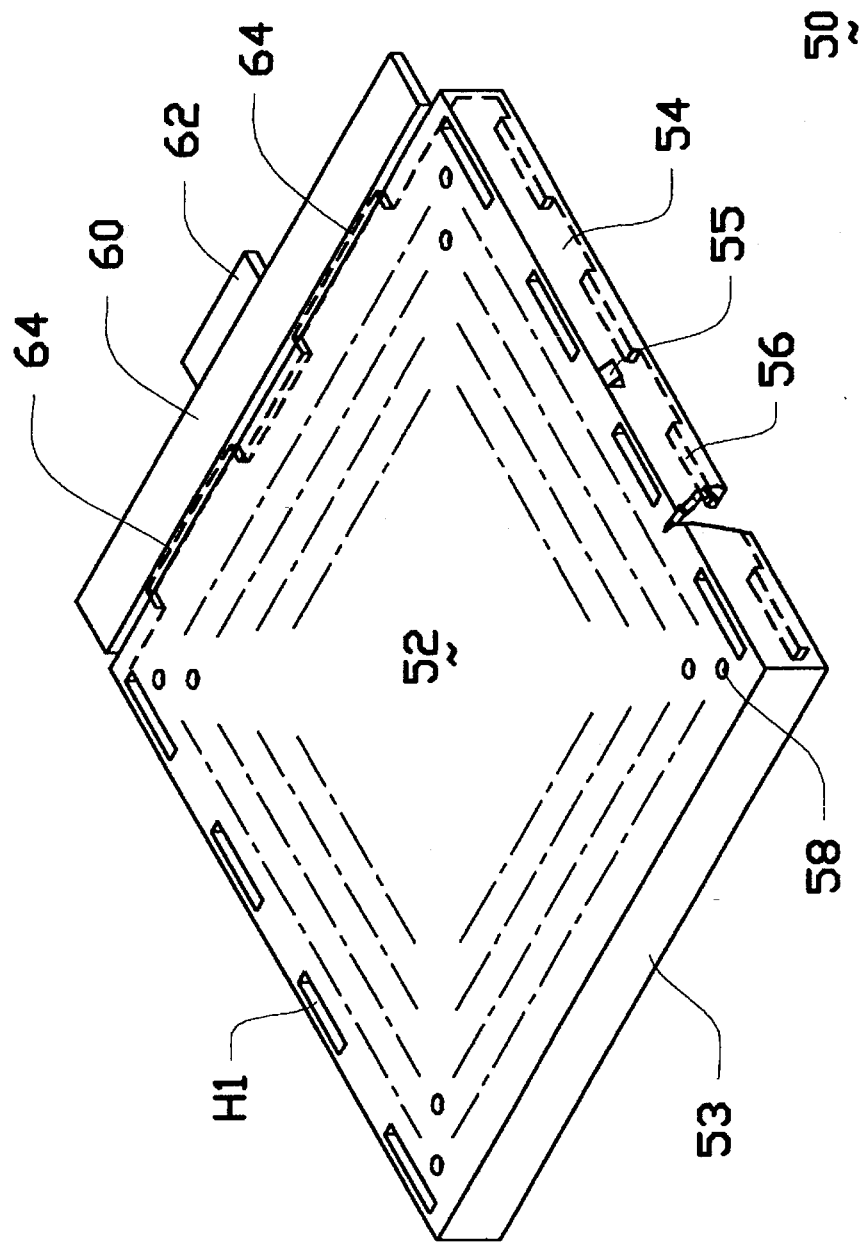
FIG. 3 is a prospective view of the cover of the socket assembly of FIG. 1 with a portion thereof cut-away to show the detent structure on the underside.

Also with reference to FIGS. 1 and 3, a cover 50 having a generally square main plate 52. A vertical front wall 53, two left and right side walls 54 respectively extend downward from the front, the left and the right edges of the plate 52, and no vertical wall is disposed at the rear edge of the plate 52. Four elongated inwardly detents 56 are at intervals positioned along the lower edge of each right side wall and left side wall 54 for vertically latchable engagement with the corresponding ledges 16 of the base housing 10 to prevent the cover 50 from upward moving away from the base housing 10. A plurality of holes 58 vertically extend through the plate 52 for corresponding to and alignment with the cavities 14 of the base housing 10, respectively. A protruding plate 60 horizontally rearward project from the rear end of the plate 52. A retention bar 62 outwardly and rearward extends at the rear edge of the protruding plate 60 for reception within the aperture 46 of the base housing 10 when assembled. A pair of spaced pressing bars 64 are disposed on the rear end of the plate 52 and closely below the protruding plate 60. It can be seen that the length of the bar 64 is substantially equal to or smaller than the space between the end wall 32 and the intermediate wall 34 so that bars 64 can be respectively received in such spaces without any improper interference when the cover 50 is movably attached to the base housing 10. It is also contemplated that the length of the protruding plate 60 is smaller than the width of the plate 52 and substantially equal to the distance defined between the two protrusions 36. Hence, the protruding plate 60 may pass the space between these two protrusions 36 of the base housing 10 to move from the front side portion 31 of the shroud section 30 of the base housing 10 to the rear side portion 40 thereof for assembling the whole socket 1.

Figure 4:
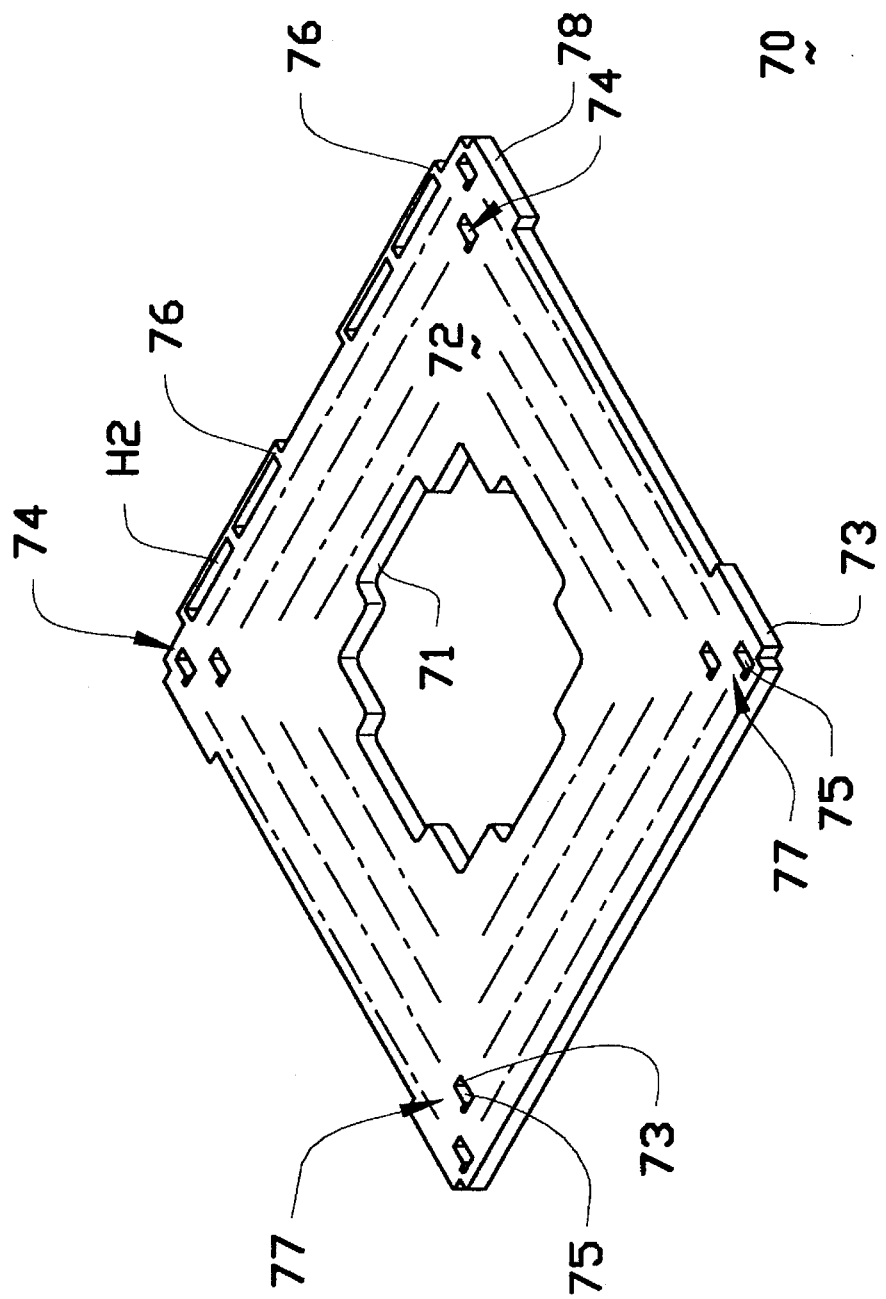
FIG. 4 is a prospective view of the sliding plate of the socket assembly of FIG. 1.

Also referring to FIGS. 1 and 4, a sliding or moveable plate 70 is sandwiched between the base housing 10 and the cover 50. The sliding plate 70 includes a generally square body 72 and a plurality of orifices 74 extending therethrough in alignment with the corresponding cavities 14 of the base housing 10 and the holes 58 of the cover 50. A pair of engagement bars 76 are integrally outwardly formed at the rear edge of the sliding plate 70. Understandably, the length of the bar 76 is substantially equal to or smaller than the space between the end wall 32 and the intermediate wall 34 for easy passage therebetween without obstruction. A front and a rear lateral expansion portions 78 are disposed on each side edge of the sliding plate 70 for properly interferential engagement with the inner surfaces of the cover 50 for the purpose of guiding the siding plate 70 to move with regard to the cover 50 in a front-to-back direction.

Figure 5:
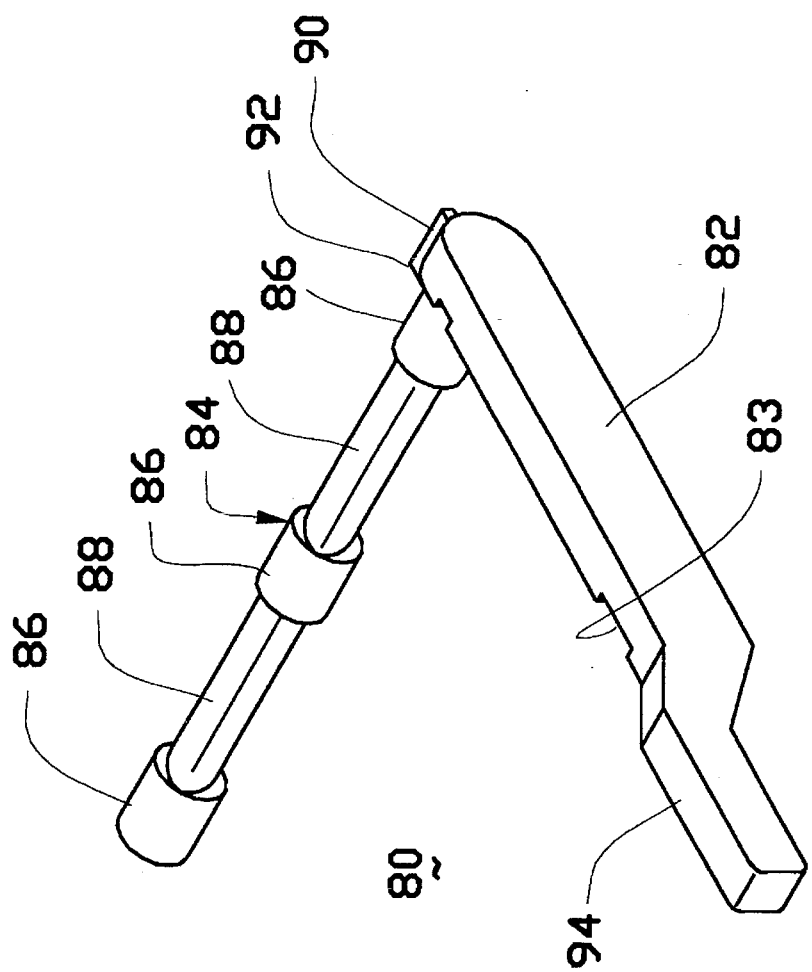
FIG. 5 is a prospective view of the actuation lever of the socket assembly of FIG. 1.

Also referring to FIGS. 1 and 5, an actuation lever 80 includes an operation handle 82 seated by the right side of the base housing 10. A transmission or cam shaft 84 integrally and perpendicularly extending from the rear end of the operation handle 82, includes three supporting sections 86 at intervals and two camming sections 88 intermediate between every two supporting sections 86, and is designedly disposed in the U-shaped channel 38 of the base housing 10. In this embodiment, each supporting section 86 is of a generally fully cylinder type for complete reception and support within the U-channel 38 of the base housing 10 such that such supporting section 86 functions as a supporting point when the operation handle 82 is pivoted around the U-shaped channel. Differently, the camming section 88 has a reduced dimension and a non-round cross-sectional configuration in comparison with the supporting section 86. Such non-round cross-sectional shape provides the camming section 88 with camming function when the camming section 88 and the integral supporting section 86 are rotated about the same axis which is axially defined at the center of the supporting section 86.

It is noted that the pair of engagement bars 76 of the sliding plate 70 are designedly confronting and engaged with corresponding two separate camming sections 88, respectively. Therefore, the sliding plate 70 can be actuated to move forward by the camming sections 88 when the camming sections 88 and their integral supporting sections 86 are rotated about the center axis of the supporting section 86.

A rear end of the operation handle 82 is integrally and fixedly connected to the outermost right-hand side supporting section 86 wherein a key 90 is horizontally disposed on the outermost center portion of the semi-circle configuration of the side view of such rear end of the operation handle 82. Hence, the innermost end 92 of such key 90 moves along the vertical groove 43 in the right-hand side portion of the shroud section 30 while the operation handle 82 is lifted up from its horizontal position to the vertical position. At the same time, the cam shaft 84 is dependently rotated at generally 90 degrees correspondingly for pushing the sliding plate 70 outwardly (forwardly).

The tail portion 94 of the operation handle 82, which is close to the free end, is upwardly offset for allowance of sufficient space thereunder for easy operation.

Figure 6:
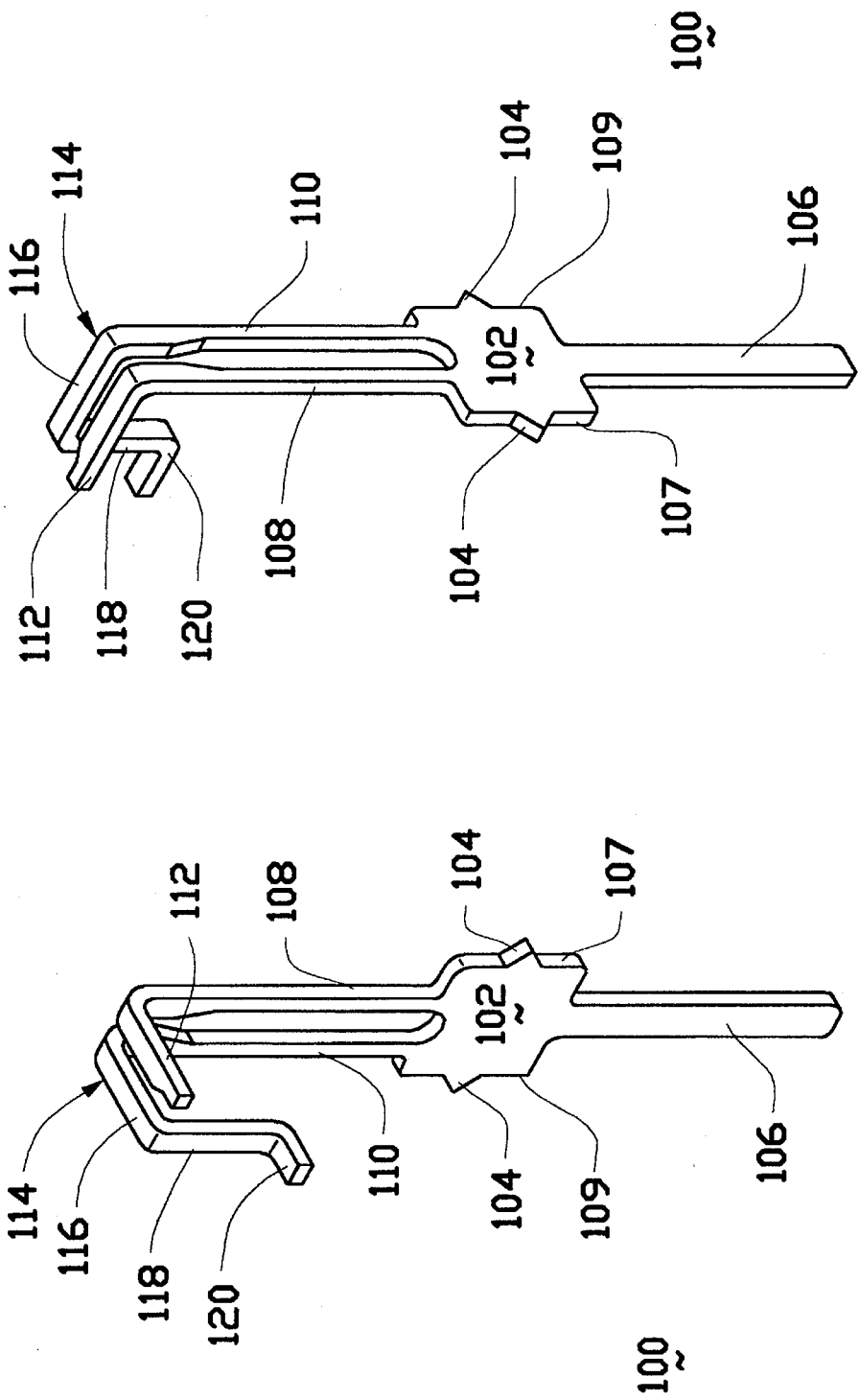
FIG. 6(A) is a prospective view of the contact for use within the socket assembly of FIG. 1.
FIG. 6(B) is another prospective view of the contact of the FIG. 6 (A).

Also with reference to FIGS. 6(A) and 6(B), disposed within each cavity 14 of the base housing 10 is a contact 100 including a main generally square segment 102 having a pair of barbs 104 on two opposite sides for interferential securement within the cavity 14 of the base housing 10. A tail 106 extends downward from the bottom of the main segment 102 for solderable reception within a corresponding hole of a board (not shown) on which the socket is mounted. A pair of spaced active arm 108 and immoveable arm 110 extend from the top of the main segment 102 wherein an engagement section 112 integrally and straight extends perpendicularly from the top of the arm 108. Differently, a retention section 114 of two right angle bends integrally extends from the top of the arm 110 in the same direction of the engagement section 112 of the arm 108. The retention section 114 includes an upper horizontal section 116 extending from the top of the arm 110 and generally at the same height as the engagement section 112. An intermediate section 118 downward extends from the outermost end of the upper horizontal section 116 thus forming a first right angle bend. A lower horizontal section 120 extends from the lower end of the intermediate section 118 in the same direction as the upper horizontal section 116, thus forming the second right angle bend. It can be noted that the total length of the upper and the lower horizontal sections 116 and 120 of the arm 110 are designedly generally equal to that of the engagement section 112 of the arm 108, so that the tips of the lower horizontal sections 120 of the arm 110 and of the engagement section 112 of the arm 108 are generally aligned in the same vertical plane.

Figure 7:
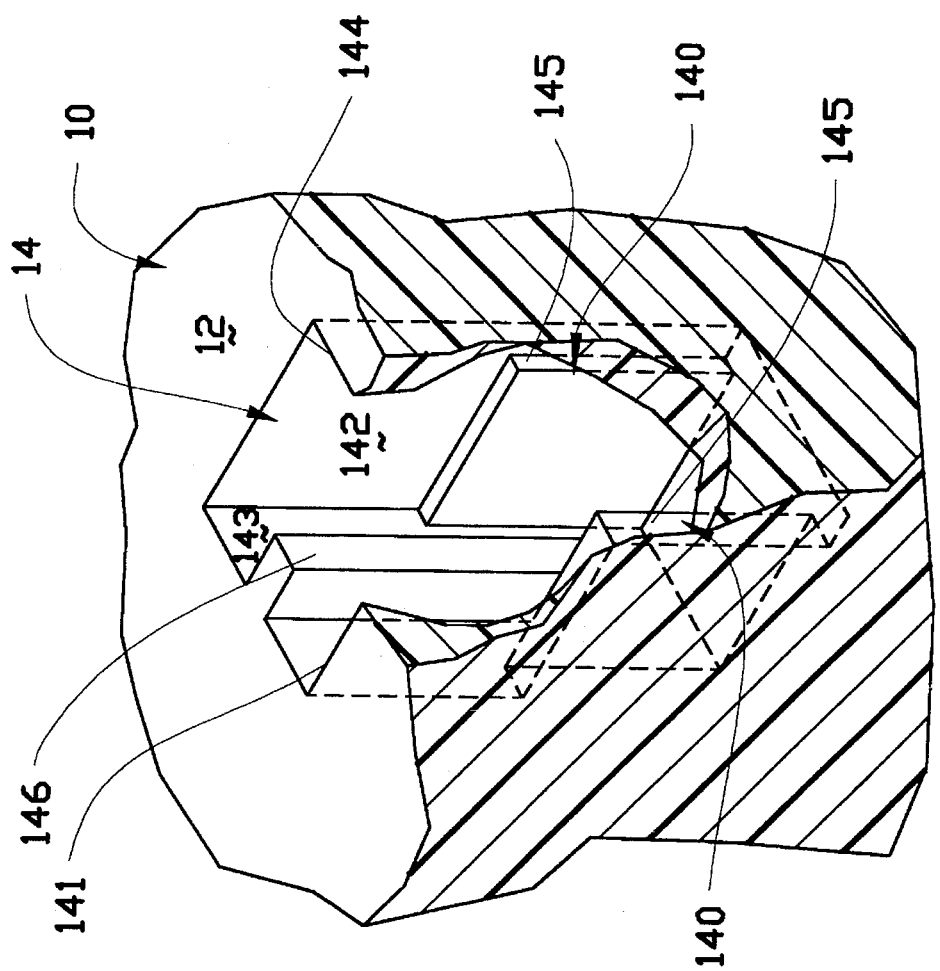
FIG. 7 is a fragmentary cut-away view of the base housing of FIG. 2 to show the retention bar and the blocks in the cavity.

Referring to FIG. 7, to receptively comply with the contact 100, each cavity 14 in the base housing 10 having generally a square cross section lengthwise, are surrounded and formed by the inner front wall 141, rear wall 142, left-hand side wall 143 and right-hand side wall 144. In the cavity 14, a pair of blocks 140 are disposed on the inner front wall 141 and the rear wall 142, respectively wherein each block 140 extends from the bottom opening of the cavity 14 thereunto and generally terminates at the mid-length thereof. Those two blocks 140 are integrally connected to the left-hand side wall 143 but spaced away from the right-hand side wall 144 by a distance. In this embodiment, such distance is substantially equal to the thickness of the main segment 102 of the contact 100 so that the left-hand side portion and the right-hand side portion of the main segment 102 of the contact 100 can be securely sandwiched between the open side edges 145 of the blocks 140 and the right-hand side wall 144, respectively, for engagement in the cavity 14 of the base housing 10.

It is also appreciated that the width of the main segment 102 of the contact 100 is substantially equal to the distance defined between the front wall 141 and the rear wall 142 such that the left and right edges 107,109 of the main segment 102 of the contact 100 abut against the front wall 141 and the rear wall 142 in the cavity 14 with their associated barbs 109 embedded into the corresponding front wall 141 and the rear wall 142 for securement. Therefore, the contact 100 can be snugly and tightly retained within the cavity 14 without moving.

To correspond to the retention section 114 of the immoveable arm 110 of the contact 100, a retention bar 146 vertically extends along the mid-region of the left-hand side wall 143 and protrudes into the cavity 14. Hence, the lower horizontal section 120 of the retention section 114 is aligned with the retention bar 146 in the front-to-back direction for preventing the arm 110 from moving forwardly when a forward force acts on the contact 100. Referring back to FIG. 4, relatively, each orifice 74 in the sliding plate 70 originally has a generally square configuration in compliance with the shape of the cavity 14 in the base housing 10. Like the cavity 14, in correspondence to the engagement section 112 of the arm 108 of the contact 100, an longitudinal pushing bar 75 occupies a portion of the orifice 74 and forms a groove 77 by its side for reception of the tip of engagement section 112 of the active arm 108 of the contact 100 therein. Accordingly, the pushing bar 75 actuates the engagement section 112 of the active arm 108 of the contact 100 forwardly when the sliding plate 70 moves forwardly.

During assembling, the cover 50 is installed on the top of the base housing 10 in a front-to-back direction with the bottoms of the left and right walls 54 supportively engaged with the second set of ledges 20 of the base housing 10 under the condition that the sliding plate 70 is placed to be sandwiched between the base housing 10 and the cover 50. At the same time, the top surfaces of the detents 56 of the cover 50 engage the bottom surfaces of the first set of ledge 16, and therefore the cover 50 can not move up and down. The cover 50 successively rearward moves to the shroud section 30 of the base housing 10 with the cam shaft 84 of the actuation lever 80 having been placed in the U-shaped channel 38 therein under the condition that the supporting sections 86 of the cam shaft 84 of the actuation lever 80 are seated against inner surface of the shroud section 30 facing the U-shaped channel 38, and generally aligned with the corresponding end walls 32 and intermediate wall 34, respectively, and the camming sections 88 thereof are generally aligned with the corresponding spaces between such end wall 32 and intermediate wall 34. As a result, the operation handle 82 is positioned in parallel relation to the base housing 10 and the innermost end 92 of the key 90 of the actuation lever 80 is received with in the vertical groove 43 in a position which is generally at the same level as the lying operation handle 82.

Such rearward movement of the cover 50 continues until the rear edge of the main plate 52 of the cover 50 confronts the upper portions of the end walls 32 and the intermediate wall 34 of the base housing 10, the rear edges of the side walls 54 confront the corresponding end walls 32 of the base housing 10, and the front wall 53 is located on the front ledge 24 of the base housing 10. In this situation, the protruding plate 60 of the cover 50 extends into the shroud section 30 of the base housing 10 and is positioned over the U-shaped channel 38 in the base housing 10 in the condition that the front portion of the protruding plate 60 is seated on the top of the intermediate wall 34 and the end walls 32 of the base housing 10, and the rear portion of the protruding plate 60 is receptively engaged within the horizontal groove 42 in the shroud section 30 and seated on the step 44 thereof. It can be appreciated that the protruding plate 60 is retained between two protrusions 36 positioned respectively on the top of the end walls 32 of the base housing 10, and the bar 62 at the rear end of the protruding plate 60 is designedly received within the corresponding aperture 46 in the rear side portion 40 of the shroud section 30. Accordingly, the protruding plate 60 covers and shields the U-shaped channel 38 and the cam shaft 84 of the actuation lever 80 therein.

It can be contemplated that two engagement bars 76 extending rearward from the rear edge of the sliding plate 70 which is sandwiched between the cover 50 and the base housing 10, can respectively pass the spaces defined between the intermediate wall 34 and the end walls 32 of the base housing 10, and project into the U-shaped channel 38 in the shroud section 30 for confrontation with the camming section 88 of the actuation lever 80. The pressing bars 64 positioned beneath the protruding plate 60 and extending rearward from the rear edge of the plate 52, can also respectively pass such spaces and project into the U-shaped channel 38 in the shroud section 38 but without engaging the camming section 88 of the cam shaft 84. Naturally, the engagement bars 76 of the sliding plate 70 are generally positioned below the pressing bars 64 of the cover 50, respectively, so that the pressing bars 64 of the cover 50 can provide guidance to the horizontal movement of the engagement bars 76 of the sliding plate 70. It is also noted that the sliding plate 70 can not move forwardly or laterally because of confinement of the front wall 53 and the side walls 54 of the cover 50, and also not move rearward due to confrontation of the rear edge thereof with the intermediate wall 34 and the end walls 32 of the base housing 10. In this situation, the holes 58 in the cover 50, the corresponding orifices 74 in the sliding plate 70, and the corresponding cavities 14 in the base housing 10, are generally aligned together in a vertical direction, respectively, for respective reception of the corresponding contacts 100 and the downward extending conductive pin of PGA components (not shown).

Finally, the contacts 100 are inserted into the cavities 14 in the base housing 10 from the bottom. As aforementioned, the main body 12 of each contact 100 can be retained within the corresponding cavity 14 with the engagement of the associated opposite side barbs 109. The engagement section 112 of the active arm 108 and the upper horizontal section 116 of the retention section 114 of the immoveable arm 110 of each contact 100 further upwardly project into the corresponding orifice 74 in the above sliding plate 70 wherein the tip of the engagement section 112 further horizontally projects into the groove 77 in the orifice 74. The tails 106 of the contact 100 downward extend out of the base housing 10 for solderably mounting to the PC board on which the socket 1 is seated.

Figure 8:
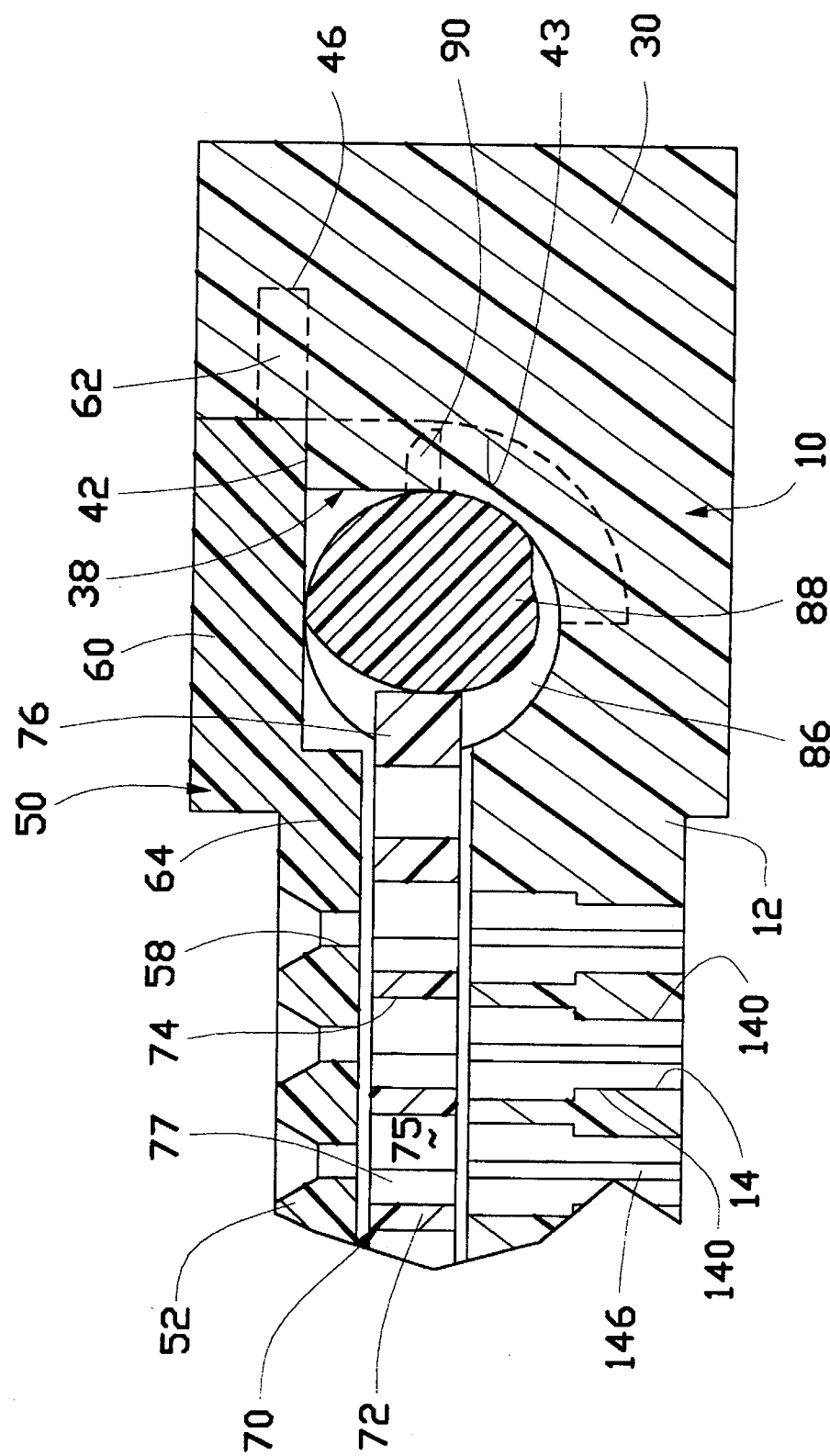
FIG. 8(A) is a fragmentary cross-sectional view of the assembled socket assembly of FIG. 1 without the contacts therein when the operation handle is in a horizontal position.
FIG. 8(B) is a fragmentary cross-sectional view of the assembled socket assembly of FIG. 1 without the contacts therein to show the camming section of the cam shaft of the actuation lever engaging and pushing the sliding plate forward when the operation handle is in a vertical position.
Figure 8:
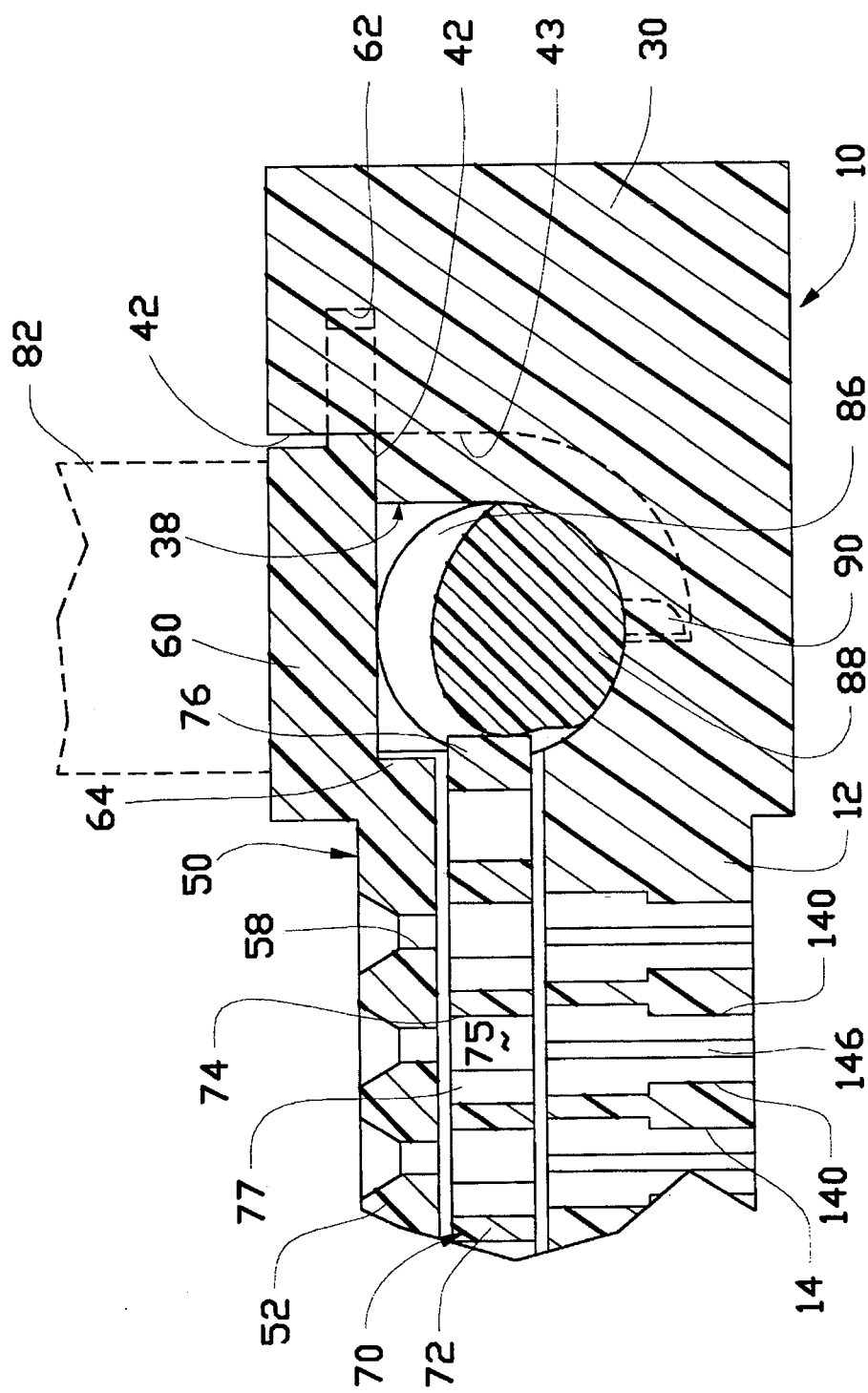

Referring to FIGS. 8(A) and 8(B), when the PGA component is intended to be electrically engaged with and mounted on the socket 1, the cam shaft 84 of the actuation lever 80 is itself rotated at generally 90 degrees through the operation handle 82 of the actuation lever 80 being upward pivoted from the forward or horizontal position to the upward or vertical position by serving the supporting section 86 of the actuation lever 80 as the supporting point in the U-shaped channel 38. Accordingly, the camming section 88 of the cam shaft 84 associatively rotates at generally 90 degrees within the channel 38 and its rotation simultaneously actuates the engagement bars 76 of the sliding plate 70 to move forwardly with regard to the base housing 10 due to the camming surface thereof.

As shown in FIGS. 9(A) and 9(B), the forward movement of the sliding plate 70 causes the engagement section 112 of the active arm 108 of each contact 100 to also deflect forwardly because the retention bar 146 within each orifice 74 engages and pushes forwardly the tip of the corresponding engagement section 112 of the contact 100 which is positioned within the groove 77 in the orifice 74. Differently, the forward movement of the sliding plate 70 does not push the retention sections 114 of the immoveable arm 110 forwardly because the inner rear wall surface 73 of the sliding plate 70 which defines such orifice 74, is relatively far from the retention section 114. It can be seen in FIG. 9(B) that the inner wall surface 73 facing the orifice 74 just slightly confronts the retention section 114 of the immoveable arm 110 when the sliding plate 70 is in its final outermost position so that it is understood that the retention section 114 of the immoveable arm 110 is not forced by the sliding plate 70.

Moreover, even though the active arm 108 is actuated to deflect forward by the sliding plate 70, the retention bar 146 in the cavity 14 prevents the immoveable arm 110 of the contact 100 from moving forwardly under a forward movement intention incurred by forward deflection of the active arm 108 of the contact 100. Accordingly, for each contact 100, the distance or the space between the upper horizontal section 116 of the retention section 114 of the immoveable arm 110 and the engagement section 112 of the active arm 108 increases by the forward deflection of the active arm 108. Such enlarged space (or distance) is bigger than the dimension (or diameter) of the conductive pin of the PGA component which is to be inserted into the socket 1, such that the insertion of the conductive pin can be achieved without interference through zero insertion force (ZIF). Therefore, the socket 1 with its associated inner contacts 100 can be deemed as in such a fully open position or in an operative state for loading the PGA component, as shown in FIG. 9(B).

Referring to FIGS. 9(A) and 9(B), it is also noted that the cover 50 is also forced to move forward by the forward moving sliding plate 70 when the front edge of the forward moving sliding plate 70 confronts the front wall 53 of the cover 50. Accordingly, the cover 50 and sliding plate 70 both moves forward with regard to the base housing 10.

When the PGA component is adequately seated on the socket 1, each conductive pin thereof is inserted through the corresponding hole 58 in the cover 50 into the corresponding orifice 74 in the sliding plate 70 and positioned in the space between the upper horizontal sections 116 of the immoveable arm 110 and the engagement section 112 of the active arm 108 of the contact 100 inserted therein. The tip of the conductive pin of the PGA component may further project into the cavity 14 in the base housing 10. Successively, the operation handle 82 of the actuation lever 80 is downward pivoted from the upward position to the forward position, so that the associated camming section 84 is also rotated at generally 90 degrees back to its original position. Therefore, the camming surface of the camming section 88 retreats rearward in the horizontal direction thus disengaging the engagement bars 76 of the sliding plate 70 therefrom. Then, the sliding plate 70 is forced to move rearward by the inherent resilient forces exerted by the deflected active arms 108 of the contacts 100 because of the engagement of the pushing bar 75 with the engagement section 112 of such deflected arm 108 in each orifice 74 in the sliding plate 70. Accordingly, the sliding plate 70 is moved back to its original position.

When the deflected arm 108 and its associated engagement section 112 spring back to their normal positions, the inserted conductive pin of PGA component confronts and is successively pushed by the rearward moving engagement section 112 of the active arm 108 of the contact 100 to move rearward. It can be understood that because each conductive pin of PGA component is snugly positioned within a properly-sized hole 58 in the cover 50, the rearward movement of each conductive pin of PGA component almost simultaneously presses the inner surface of the cover 50 around the hole 58 in a front-to-rear direction, thus pushing the whole cover 50 rearward until the cover 50 is moved back to its original position. When the whole socket 1 is restored, the socket 1 and its associated inner contacts 100 can be deemed as in such a fully closed position or in a non-open state for signal transmission. In this situation, the conductive pin of PGA component is, electrically and mechanically, tightly sandwiched between the engagement section 112 of the active arm 108 and the upper horizontal section 116 of the retention section 114 of the immoveable arm 110 of the contact 100 because the originally designed distance therebetween is somewhat smaller than the diameter of the conductive pin of the PGA component. Therefore, a reliable and good electrical engagement is obtained between the socket 1 and the PGA component.

It can be understood that the replacement or the unloading of the PGA component on the socket 1 can be achieved by repeating the foregoing steps on a ZIF basis.

To limit the movement of the cover 50 with regard to the base housing 10 in the front-to-rear direction, there is a boss 17 (only one shown) positioned on each side surface 18 of the base housing 10 for designedly relatively moving within the last two adjacent rear detents 56 on the same side of each side wall 54 of the cover 50 within a limited distance defined between such two detents 56. This feature prohibits the cover 50 from moving forward too far or even leaving from the base housing 10 when there is no PGA component loaded thereon. Based on this feature, there is an interference fit occurring between the last rear detent 56 on each side wall 56 of the cover 50 and the boss 17 located on the same side surface 18 of the base housing 10 when the cover 50 is installed on the base in the front-to-rear direction.

To retain the operation handle 82 in the horizontal position for maintaining the whole socket assembly 1 in a reliable stable manner, an embossment 55 is positioned on the outer surface of right side wall 54 to incorporate a recess 83 in the operation handle 82, thus latching the actuation lever 80 with the base housing 10 without a risk of improper upward rotation. This feature also causes an interference occurring between the embossment 55 of the cover 50 and the recess 83 in the operation handle 82, when such operation handle 82 is lifted up or pushed down. The operation handle 82 of the actuation lever 80 can lie on the second set middle ledge 20 of the base housing 10 for keeping itself in the horizontal position without the possibility of downward rotation. It is appreciated that the cooperation of the key 90 of the actuation lever 80 and the vertical groove 43 in the shroud section 30 can guide the rotation of the actuation lever 80 and limit the upward movement of the operation handle 82. Moreover, when assembly, the engagement bars 76 of the sliding plate 70 is sandwiched between two adjacent supporting sections 86 of the cam shaft 84, so that the actuation lever 80 can not move in the direction along the channel 38.

The specific contours of the center opening 11 in the base housing 10 and of the center opening 71 in the sliding plate 70 are designed to maximize the dimensions of such openings for customary use while maintaining the strength of the base housing 10 and the slide plate 70.

It is also seen that the through-holes HI in the cover 50, the through-holes H2 in the sliding plate 70, and the staggering arrangements of the first set of ledges 16 with the second set of ledges 20, are all designedly configured for the consideration of molding process.

It may be experienced that if the lengths of two arms 108,110 of the contact 100 become relatively greater than the height of the main segment 102, the arm 110 may move in an opposite direction, i.e., rearward, when the arm 108 is pushed by the sliding plate 70 forward. In this situation, the retention bar 146 in the cavity 14 may no longer function as a stopper, but still may function as an guiding bar to incorporate the retention section 114 of the arm 110 and the engagement section 112 of the arm 108 for orientation when the contact 100 is loaded into such cavity 14 from the bottom during assembling. Alternately, in a simplified design without consideration of orientation of the contact in assembling, the lower horizontal section 120 and the immediate section 118 of the arm 110, and the retention bar 146 in the cavity 14 in the base housing 10 may optionally be removed therefrom in the foregoing situation.

It can be noted that the present invention is different from the aforementioned three type prior art socket assemblies. The present invention uses a three-piece socket assembly 1, i.e., the base housing 10, the sliding plate 70 and the cover 50, wherein the sliding plate 70 is adequately slidably sandwiched between the base housing 10 and the cover 50. The sliding plate 70 in the present invention only confronts the horizontal pushing forces without interests in how to combine the sliding plate to the base housing. Differently, in the first and the second type prior art socket assemblies, the sliding plate itself needs to provide relevant mechanism for directly or indirectly securely mounting on the base housing. Also, the cover 50 in the present invention does not exert forces on the contacts to deflect the contacts for zero insertion force. This is different from the third type prior art socket assembly in which two sliding plates respectively actuates the corresponding contact arms or beams to move in opposite directions for expansion the space therebetween for zero insertion force. In conclusion, in the present invention, the sliding plate only functions as and performs horizontal movement without redundant mechanism for securement, and the cover only provides the securement, for helping the sliding plate stably horizontally sliding on the base housing, without actuating the contacts directly.

While the present invention has been described with reference to a specific embodiment, the description is illustrative of the invention and is not to be construed as limiting in the invention. Various modifications to the present invention can be made to the preferred embodiment by those skilled in the art without departing from the true spirit and scope of the invention as defined by the appended claims.

Therefore, persons of ordinary skill in this field are to understand that all such equivalent structures are to be included within the scope of the following claims.

What is claimed is:

1. A contact for use with a PGA socket assembly, comprising:

a flat main square segment having barbs positioned on two opposite sides;

a tail extending downwardly from a bottom portion of the square segment for reception in a hole in a PC board on which the socket assembly is mounted; and an active arm and an immovable arm respectively extending upwardly from a top portion of the square segment and spaced from each other for clamping a conductive pin extending downwardly from a PGA component; wherein said active arm has an engagement section extending from a top portion thereof in a first direction perpendicular to the main square segment, and said immovable arm has a retention section including two ends, wherein one of the ends integrally formed with a top end of the immovable arm; and wherein the retention section of the immovable arm comprises an upper horizontal section which is positioned at a same height as the engagement section of the active arm, an intermediate section extending downwardly from one distal end of the upper horizontal section of said retention section of the immovable arm, and a lower horizontal section horizontally extending from a lower end of the said intermediate section in the same first direction.

2. The contact as described in claim 1, wherein an outer end of the lower horizontal section and an outer end of the engagement section are substantially positioned at a same vertical plane.

3. A contact (100) for use within a PGA socket assembly for receiving a pin type PGA component, comprising:

a flat main square segment (102) having barbs (104) positioned on two opposite right and left edges (107, 109), respectively;

a tail (106) extending downwardly from a bottom portion of the main square segment (102);

a first arm (108) and a second arm (110) parallel to and spaced from each other, and both extending upwardly from a top portion of the main square segment (102) wherein the main square segment (102), the tail (106) and said first arm (108) and said second arm (110) are generally in vertically a coplanar manner; and a first horizontal section (112) horizontally extending, by bending, from a top end of the first arm (108) in the first direction, and a second horizontal section (116) horizontally extending, by bending, from a top end of the second arm (110) in the same first direction, whereby the first horizontal section (112) and the second horizontal section (116) being generally at a same height and having a farthest distance with regard to the main square segment (102), commonly define therebetween a space which is somewhat smaller than a diameter of a conductive pin of the PGA component so that said conductive pin can be electrically and mechanically tightly sandwiched between the first horizontal section (112) and the second horizontal section (116).

* * * * *